April 15, 1969 M. F. AMSTERDAM ET AL 3,438,120
METHOD OF MAKING SOLAR CELL
Original Filed Sept. 9, 1964
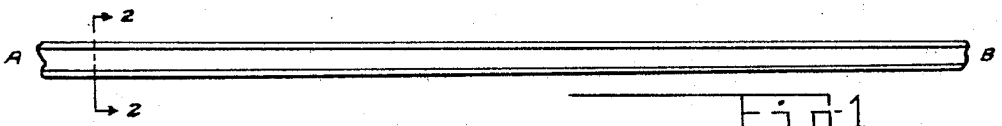
Fig-1
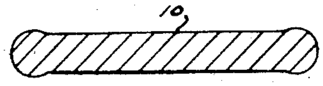
Fig-2
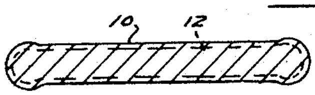
Fig-3
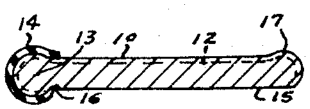
Fig-4
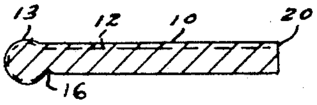
Fig-5
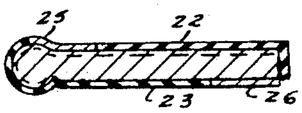
Fig-6
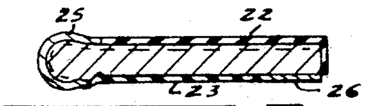
Fig-8
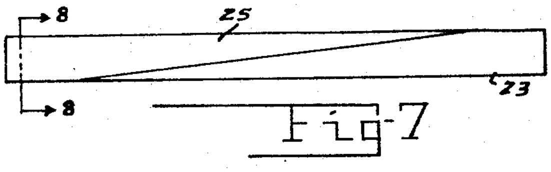
Fig-7
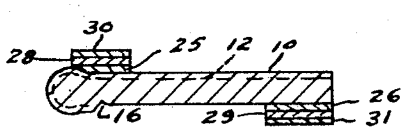
Fig-10 Fig-9
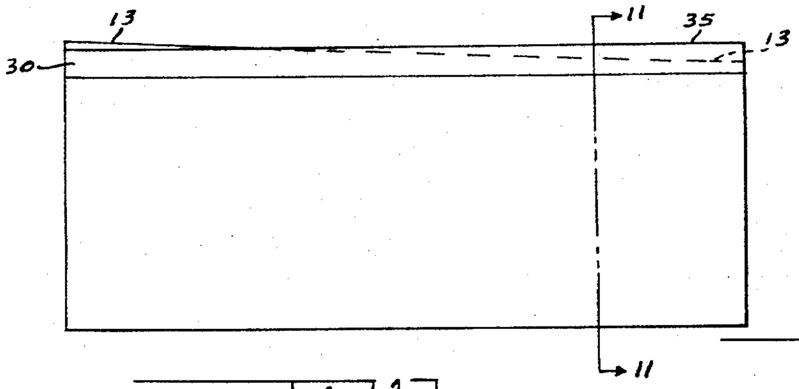
Fig-12
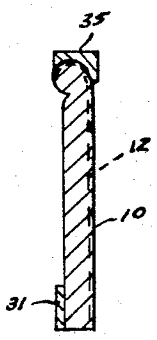
Fig-11
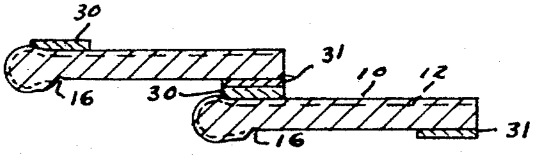
INVENTORS
M.F. AMSTERDAM
M.S. SHAIKH
K.S. TARNEJA
BY Harry A. Herbert Jr
ATTORNEY
Richard J. Killoran
AGENT United States Patent Office 3,438,120

Patented Apr. 15, 1969

3,438,120

METHOD OF MAKING SOLAR CELL

Michael F. Amsterdam, Stirling, N.J., Mohammed S. Shaikh, Garland, Tex., and Krishan S. Tarneja, Pittsburgh, Pa., assignors, by mesne assignments, to the United States of America as represented by the Secretary of the Air Force Original application Sept. 9, 1964, Ser. No. 395,343. Divided and this application May 27, 1968, Ser. No. 732,339

Int. Cl. H01l *15/02*

U.S. Cl. 29—572 2 Claims

ABSTRACT OF THE DISCLOSURE

A photovoltaic solar cell panel is made from nonuniform width dendrite N-type semiconductive webbing by cutting the dendrite webbing into panels of predetermined lengths; cleaning the panel; doping a surface layer of the panel with boron to provide a P-N junction; masking the panel; sand blasting the bottom of the panel with an aluminum oxide abrasive to remove the boron doped material; removing the masking material; lapping the other edge of the panel with silicon carbide grit to remove the doped material; masking the panel; evaporating aluminum onto the unmasked areas of the panel; removing the masking material; electroplating nickel onto the aluminum layers, solder dipping the panel to coat the nickel layers with solder and adjusting the thickness of the solder.

This is a division of copending application Ser. No. 395,343, filed Sept. 9, 1964.

*Background of the invention*

Shingling of individual solar panels to make large area solar cells from dendrite webbing poses a problem because of the nonuniform dimensions of the dendrite webbing. The growth of silicon dendrite webbing depends upon seeding two coplanar dendrites from a single seed. When the web is first seeded, the supporting edge dendrites are usually less than ¼ inch apart. As the growth continues they separate further, thus widening the sheet. A typical widening rate is about 0.1 inch/foot length. Care must be taken therefore in preparing solar cells from webbing so that the junction is not shorted when making ohmic contact to the diffused layer at the panel edge.

*Summary of the invention*

According to this invention the doped layer is left at one edge and extends over a portion of the bottom of the panel. This prevents shorting of the junction and permits the webbing to be used to provide panels of substantially uniform width.

One object of the invention is to provide a method for making substantially uniform solar cell panels from available nonuniform dendrite webbing.

*Brief description of the drawing*

FIG. 1 is a plan view of a webbed dendrite crystal as received showing the nonuniform width of the dendrite webbing;

FIG. 2 is an enlarged sectional view of a dendrite web crystal taken along the line 2—2 of FIG. 1;

FIG. 3 is a schematic showing the device of FIG. 2 after doping;

FIG. 4 shows the device of FIG. 3 with a mask after sandblasting and scratching the bottom surface;

FIG. 5 shows the device of FIG. 4 after the edge of the web crystal has been lapped;

FIG. 6 shows the device of FIG. 5 after masking and evaporation of the aluminum strip;

FIG. 7 shows the left side view of the mask of FIG. 6;

FIG. 8 shows the evaporated layers and mask along the line 8—8 of FIG. 7;

FIG. 9 shows the device of FIG. 6 with the nickel and solder applied;

FIG. 10 shows a top view of the finished solar panel with the top contact strip in place;

FIG. 11 is a sectional view of the device of FIG. 10 along the line 11—11; and

FIG. 12 shows the finished panels as they are fitted together to form the solar cell.

*Description of the preferred embodiment*

As shown in FIG. 1 the dendrite webbing has a greater width at end A than at B.

Reference is made to FIG. 2 of the drawing which shows an enlarged sectional view of a dendrite web 10. In preparing the dendrite web for use in a solar cell the dendrite web is first cut to the desired length, after which a layer of impurities is diffused into the surface of dendrite webbing, for example, with N-type starting material, the dendrite web may be exposed for an optimum time to the penetration of boron gas. A diffusion time of about eight minutes is required for a junction depth of 1 micron. Thus a PN junction is formed at 12 as shown in FIG. 3. The dendrite web is then sandblasted with aluminum oxide abrasive to remove the shiny surface after which the dendrite web is cleaned by heating in trichloroethylene and washed with deionized water. The edge 13 of the dendrite web is then covered with a mask 14. The bottom of the dendrite webbing is then sandblasted to remove the doped material thus leaving the base material exposed at 15. A groove 16 is then scratched in the bottom surface along the boundary between the masked and unmasked portion of the bottom of the dendrite web to provide a clear line between the junction layer and the cleaned base material. The edge 17 of the webbed dendrite is then lapped with silicon carbide grit or other abrasive to remove the doped material to expose the junction at 20. The end 17 and the bottom, up to and including the groove 16, are then etched in concentrated hydrogen fluoride followed by rinsing in deionized water. The webbed dendrites may then be placed in hot nitric acid to remove any film formed during the diffusion process after which the webbed dendrite is again washed, etched with hydrogen fluoride and again washed. The webbed dendrite is then coated with a standard masking material 22 and 23, as shown in FIGS. 6, 7 and 8, and layers 25 and 26 of aluminum are vacuum evaporated onto the dendrite web. The mask is then removed and nickel layers 28 and 29 are plated onto the aluminum layers. Solder layers 30 and 31 are then added by solder dipping the dendrite web. The thickness of the solder is adjusted to make the width of the dendrite web substantially uniform along its length as shown in FIG. 10 and the thickness of the panel at the edge 13 substantially uniform. Any known method such as scraping or grinding may be used to adjust the thickness of the solder. The thickness of the aluminum, nickel and solder have been exaggerated for the purpose of illustration.

FIGS. 10 and 11 show how the solder layer is coated on the dendrite web so that it extends over the edge 13 toward the narrow end of the dendrite web as shown at 35. The finished panels are located as shown in FIG. 12 to form the solar cell.

There is thus provided a method for making solar cell panels of substantially uniform dimensions from nonuniform starting material.

While a certain specific embodiment has been described, it is obvious that numerous changes may be made without departing from the general principles and scope of the invention.

We claim:

1. The method of making a photovoltaic solar cell panel from available nonuniform width dendrite semiconductive webbing with one end wider than the other, comprising: cutting the dendrite webbing into panels of predetermined lengths; cleaning said panel; exposing the panel to boron gas to permit boron to diffuse into the surface of the panel to a predetermined depth; masking one edge and a small portion of the bottom of said panel adjacent said edge along its length; removing the boron doped material from the unmasked portion on the bottom of said panel; scratching the bottom of said panel adjacent said mask to provide a groove therein; removing the masking material; removing the doped material from the other edge of said panel; masking the top and said other edge of said panel with a first mask of substantially uniform width, with the mask on the top of said panel being spaced from said one edge of the panel by a predetermined distance; masking an area on the bottom of said panel and said one edge of the panel with a second mask having a first edge equally spaced from said other edge of the panel, and a second edge extending from said groove at the narrow end of said panel over said one edge toward said wide end of said panel to a point on the top of said panel spaced from said first mask; evaporating aluminum onto the unmasked areas of said panel; removing the masking material; electroplating nickel onto said aluminum layers, solder dipping said panel to coat said nickel layers with solder and adjusting the thickness of said solder to provide a substantially uniform width for said panel and a uniform thickness at said one edge.

2. The method of making a photovoltaic solar cell panel from available nonuniform width dendrite semiconductive webbing with one end wider than the other, comprising: cutting the dendrite webbing into panels of predetermined lengths; sandblasting the panel with an aluminum oxide abrasive to remove the shiny surface; cleaning the panel by heating in trichloroethylene; washing the panel with deionized water; exposing the panel to boron gas to permit boron to diffuse into the surface of the panel to a predetermined depth; masking one edge and a small portion of the bottom of said panel adjacent said edge along its entire length; sandblasting the unmasked portion of the bottom of said panel with an aluminum oxide abrasive to remove the boron doped material; scratching the bottom of said panel adjacent said mask to provide a groove therein; removing the masking material; lapping the other edge of said panel with silicon carbide grit to remove the doped material thereon; masking the top and said other edge of said panel with a first mask of substantially uniform width, with the mask on top of said panel being spaced from said one edge of the panel by a predetermined distance; masking an area of the bottom of said panel and said one edge with a second mask having a first edge equally spaced from said other edge of the panel, and a second edge extending from said groove at the narrow end of said panel over the one edge toward the wide end of the panel to a point on the top of said panel spaced from said first mask by a predetermined distance; evaporating aluminum onto the unmasked areas of said panel; removing the masking material; electroplating nickel onto said aluminum layers, solder dipping said panel to coat said nickel layers with solder and adjusting the thickness of said solder to provide a substantially uniform width for said panel and a uniform thickness at said one edge.

References Cited

UNITED STATES PATENTS

| | | | |
|---|---|---|---|
| 3,015,590 | 1/1962 | Fuller. | |
| 3,147,414 | 9/1964 | Pelfrey et al. | |
| 3,261,076 | 7/1966 | Schroder et al. | 136—89 X |
| 3,350,775 | 11/1967 | Iles. | |

A. B. CURTIS, *Primary Examiner.*

U.S. Cl. X.R.

29—578